(12) United States Patent
Novak (10) Patent No.: US 8,243,253 B2
(45) Date of Patent: Aug. 14, 2012

(54) LYOPHOBIC RUN-OFF PATH TO COLLECT LIQUID FOR AN IMMERSION LITHOGRAPHY APPARATUS

(75) Inventor: W. Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/155,377

(22) Filed: Jun. 3, 2008

(65) Prior Publication Data
US 2008/0239261 A1   Oct. 2, 2008

Related U.S. Application Data

(60) Division of application No. 11/235,323, filed on Sep. 27, 2005, now Pat. No. 7,397,532, which is a continuation of application No. PCT/US2004/009993, filed on Apr. 1, 2004.

(60) Provisional application No. 60/462,114, filed on Apr. 10, 2003.

(51) Int. Cl.
*G03B 27/52* (2006.01)
(52) U.S. Cl. ......................................................... 355/30
(58) Field of Classification Search .................... 355/30, 355/67, 53
See application file for complete search history.

(56) References Cited

U.S. PATENT DOCUMENTS

| | | | |
|---|---|---|---|
| 3,648,587 A | 3/1972 | Stevens | |
| 4,346,164 A | 8/1982 | Tabarelli et al. | |
| 4,480,910 A | 11/1984 | Takanashi et al. | |
| 5,610,683 A | 3/1997 | Takahashi | |
| 5,715,039 A | 2/1998 | Fukuda et al. | |
| 5,825,043 A | 10/1998 | Suwa | |
| 6,191,429 B1 | 2/2001 | Suwa | |
| 6,270,212 B1 * | 8/2001 | Kusumi et al. | 347/93 |
| 6,788,477 B2 | 9/2004 | Lin | |
| 6,988,327 B2 * | 1/2006 | Garcia et al. | 34/407 |
| 7,397,532 B2 | 7/2008 | Novak | |
| 2002/0109850 A1 | 8/2002 | Takai et al. | |
| 2002/0163629 A1 | 11/2002 | Switkes et al. | |
| 2003/0030916 A1 | 2/2003 | Suenaga | |
| 2003/0174408 A1 | 9/2003 | Rostalski et al. | |
| 2004/0000627 A1 | 1/2004 | Schuster | |

(Continued)

FOREIGN PATENT DOCUMENTS

DE   221 563 A1   4/1985

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner* — Peter B Kim
*Assistant Examiner* — Chia-how Michael Liu
(74) *Attorney, Agent, or Firm* — Oliff & Berridge, PLC (57) ABSTRACT

An exposure apparatus for transferring an image to a device includes an optical assembly, an immersion fluid system, and a device stage assembly. The optical assembly is positioned so that there is a gap above the device. The immersion fluid system fills the gap with an immersion fluid. The device stage assembly includes a sloped region that facilitates movement of the immersion fluid that exits the gap away from the device. The device stage assembly can include a collection region and a recovery system that recovers immersion fluid from the collection region.

20 Claims, 9 Drawing Sheets

U.S. PATENT DOCUMENTS

| | | |
|---|---|---|
| 2004/0075895 A1 | 4/2004 | Lin |
| 2004/0109237 A1 | 6/2004 | Epple et al. |
| 2004/0109981 A1 | 6/2004 | Lawrence et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219482 A1 | 10/2005 | Baselmans et al. |
| 2005/0219488 A1 | 10/2005 | Nei et al. |
| 2005/0219499 A1 | 10/2005 | Maria Zaal et al. |
| 2005/0225737 A1 | 10/2005 | Weissenrieder et al. |
| 2005/0270505 A1 | 12/2005 | Smith |

FOREIGN PATENT DOCUMENTS

| | | |
|---|---|---|
| DE | 224 448 A1 | 7/1985 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-124873 | 5/1994 |
| JP | A-11-176727 | 7/1995 |
| JP | A-7-220990 | 8/1995 |
| JP | A-8-316125 | 11/1996 |
| JP | A 10-258249 | 9/1998 |
| JP | A-10-303114 | 11/1998 |
| JP | A-10-340846 | 12/1998 |
| JP | A-2000-58436 | 2/2000 |
| WO | WO 99/49504 | 9/1999 |
| WO | WO 02/091078 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3$^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

Ulrich et al., "The Development of Dioptric Projection Lenses for DUV Lithography," Proceedings of SPIE vol. 4832, pp. 158-169, 2002.

Chappel, Report—Trade press reprints on immersion lithography, "What Tech Will Win the NGL Race?," "Intel Not Keen on Immersion" and "Significant Progress in Immersion Lithography Shown by Researchers at International Sematech-Sponsored Industriy-Wide Workshop," pp. 1-6, Feb. 25, 2003.

Switkes et al., "Resolution enhancement of 157 nm lithography by liquid immersion," Society of Photo-Optical Instrumentation Engineers, pp. 225-228, Oct. 2002.

Smith et al., "Water Immersion Optical Lithography for the 45nm Node," Optical Microlithography XVI, Prcoceedings of SPIE vol. 5040, pp. 679-689, 2003.

Owen et al., "1/8 μm optical lithography," J. Vac. Sci. Technol. B, vol. 10, No. 6, pp. 3032-3036, Nov./Dec. 1992.

Owa et al., "Immersion lithography; its potential performance and issues," Proceedings of SPIE, vol. 5040, pp. 724-733, 2003.

Kawata et al., "Optical Projection Lithography Using Lenses with Numerical Apertures Greater Than Unity," Microelectronic Engineering 9, Elsevier Science Publishers B.V., pp. 31-36, 1989.

Hafeman et al., "Simulation of imaging and stray light effects in immersion lithography," Optical Microlithography XVI, Proceedings of SPIE, vol. 5040, pp. 700-712, 2003.

Back et al., "Simulation Study of Process Latitude for Liquid Immersion Lithography," Optical Microlithography XVI, Proceedings of SPIE, vol. 5040, pp. 1620-1630, 2003.

Feuer et al., "Projection Photolithography-Liftoff Techniques for Production of 0.2 μm Metal Patterns,"IEEE Transactions on Electron Devices, vol. ED-28, No. 11, pp. 1375-1378, 1981.

Kawata et al., "Fabrication of 0.2 μm Fine Patterns Using Optical Projection Lithography with an Oil Immersion Lens," Jpn. J. Appl. Phys., vol. 31, pp. 4174-4177, 1992.

Office Action issued in U.S. Appl. No. 11/235,323 on Jan. 29, 2007.

Office Action issued in U.S. Appl. No. 11/235,323 on Oct. 16, 2007.

Notice of Allowance issued in U.S. Appl. No. 11/235,323 on Mar. 4, 2008.

Feb. 1, 2011 Office Action issued in Korean Patent Application No. 2005-7019304 (with English translation).

* cited by examiner

Fig. 6B

LYOPHOBIC RUN-OFF PATH TO COLLECT LIQUID FOR AN IMMERSION LITHOGRAPHY APPARATUS

RELATED APPLICATIONS

This is a Division of U.S. Patent Application No. 11/235,323 filed Sept. 27, 2005 (now U.S. Pat. No. 7/397,532), which in turn is a Continuation of International Application No. PCT/US2004/009993 filed Apr. 1, 2004, which claims the benefit of U.S. Provisional Patent Application No. 60/462,114 filed Apr. 10, 2003. The disclosures of these applications are incorporated herein by reference in their entireties.

BACKGROUND

Exposure apparatus are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, and a measurement system that precisely monitors the position of the reticle and the wafer.

Immersion lithography systems utilize a layer of immersion fluid that fills a gap between the optical assembly and the wafer. The wafer is moved rapidly in a typical lithography system and it would be expected to carry the immersion fluid away from the gap. This immersion fluid that escapes from the gap can interfere with the operation of other components of the lithography system. For example, the immersion fluid can interfere with the measurement system that monitors the position of the wafer.

SUMMARY

The invention is directed to an exposure apparatus for transferring an image to a device. In one embodiment, the exposure apparatus includes a support, an optical assembly, an immersion fluid source and a device stage assembly. A gap separates the optical assembly from the device. The immersion fluid source delivers an immersion fluid to the gap. The support supports the device. In one embodiment, the device stage assembly includes a sloped region positioned near the device. The sloped region facilitates the flow of the immersion fluid that exits the gap away from the device.

In one embodiment, the sloped region includes one or more coatings and/or one or more features that facilitate movement of the immersion fluid down the sloped region. For example, a hydrophobic type coating and/or a hydrophilic type coating can be utilized.

In one embodiment, the device stage assembly includes a collection region that receives immersion fluid from the sloped region and a recovery device that removes immersion fluid from the collection region.

In one embodiment, the sloped region includes a first subregion having a first characteristic and a second subregion having a second characteristic that is different than the first characteristic. As an example, the first characteristic can include a first coating and the second characteristic can include a second coating that is different than the first coating.

In another embodiment, the first subregion is at a first angle relative to a top of the device, the second subregion is at a second angle relative to the top of the device, and the first angle is different than the second angle. In this embodiment, the device table assembly can include a first collection region that is in fluid communication with the first subregion, a second collection region that is in fluid communication with the second subregion, and a recovery device that removes immersion fluid from the collection regions.

The invention also is directed to an exposure apparatus, a wafer, a device, a method for controlling an environment in a gap, a method for making an exposure apparatus, a method for making a device, and a method for manufacturing a wafer.

BRIEF DESCRIPTION OF THE DRAWINGS

The invention will be described in conjunction with the following drawings of exemplary embodiments in which like reference numerals designate like elements, and in which.

DETAILED DESCRIPTION OF EMBODIMENTS

Figure 1:
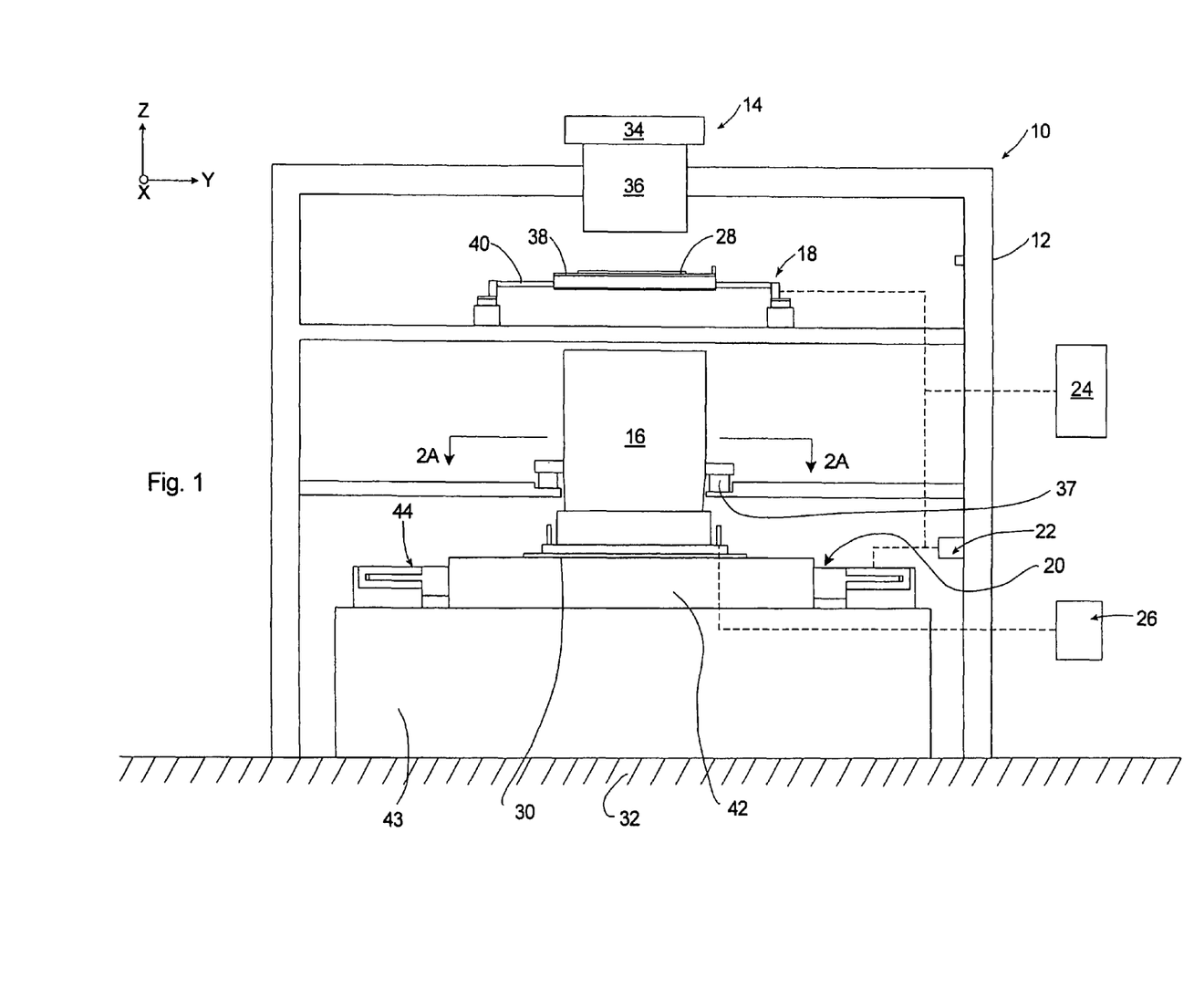
FIG. 1 is a side illustration of an exposure apparatus having features of the invention.

FIG. 1 is a schematic illustration of a precision assembly, namely an exposure apparatus 10 having features of the invention. The exposure apparatus 10 includes an apparatus frame 12, an illumination system 14 (irradiation apparatus), an optical assembly 16, a reticle stage assembly 18, a device stage assembly 20, a measurement system 22, a control system 24, and a fluid environmental system 26. The design of the components of the exposure apparatus 10 can be varied to suit the design requirements of the exposure apparatus 10.

A number of Figures include an orientation system that illustrates an X axis, a Y axis that is orthogonal to the X axis, and a Z axis that is orthogonal to the X and Y axes. It should be noted that these axes also can be referred to as the first, second and third axes.

The exposure apparatus 10 is particularly useful as a lithographic device that transfers a pattern (not shown) of an integrated circuit from a reticle 28 onto a semiconductor wafer 30 (illustrated in phantom). The wafer 30 also is referred to generally as a device, or work piece. The exposure apparatus 10 mounts to a mounting base 32, e.g., the ground, a base, or floor or some other supporting structure.

There are a number of different types of lithographic devices. For example, the exposure apparatus 10 can be used as a scanning type photolithography system that exposes the pattern from the reticle 28 onto the wafer 30, with the reticle 28 and the wafer 30 moving synchronously. In a scanning type lithographic apparatus, the reticle 28 is moved perpendicularly to an optical axis of the optical assembly 16 by the reticle stage assembly 18, and the wafer 30 is moved perpendicularly to the optical axis of the optical assembly 16 by the wafer stage assembly 20. Irradiation of the reticle 28 and exposure of the wafer 30 occur while the reticle 28 and the wafer 30 are moving synchronously.

Alternatively, the exposure apparatus 10 can be a step-and-repeat type photolithography system that exposes the reticle 28 while the reticle 28 and the wafer 30 are stationary. In the step and repeat process, the wafer 30 is in a constant position relative to the reticle 28 and the optical assembly 16 during the exposure of an individual field. Subsequently, between consecutive exposure steps, the wafer 30 is consecutively moved with the device stage assembly 20 perpendicularly to the optical axis of the optical assembly 16 so that the next field of the wafer 30 is brought into position relative to the optical assembly 16 and the reticle 28 for exposure. Following this process, the images on the reticle 28 are sequentially exposed onto the fields of the wafer 30, and then the next field of the wafer 30 is brought into position relative to the optical assembly 16 and the reticle 28.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The apparatus frame 12 supports the components of the exposure apparatus 10. The apparatus frame 12 illustrated in FIG. 1 supports the reticle stage assembly 18, the wafer stage assembly 20, the optical assembly 16 and the illumination system 14 above the mounting base 32.

The illumination system 14 includes an illumination source 34 and an illumination optical assembly 36. The illumination source 34 emits a beam (irradiation) of light energy. The illumination optical assembly 36 guides the beam of light energy from the illumination source 34 to the optical assembly 16. The beam illuminates selectively different portions of the reticle 28 and exposes the wafer 30. In FIG. 1, the illumination source 34 is illustrated as being supported above the reticle stage assembly 18. Typically, however, the illumination source 34 is secured to one of the sides of the apparatus frame 12 and the energy beam from the illumination source 34 is directed to above the reticle stage assembly 18 with the illumination optical assembly 36.

The optical assembly 16 projects and/or focuses the light passing through the reticle 28 onto the wafer 30. Depending upon the design of the exposure apparatus 10, the optical assembly 16 can magnify or reduce the image illuminated from the reticle 28. The optical assembly 16 need not be limited to a reduction system. It also could be a 1× or magnification system.

In one embodiment, the optical assembly 16 is secured to the apparatus frame 12 with one or more optical mount isolators 37. The optical mount isolators 37 inhibit vibration of the apparatus frame 12 from causing vibration to the optical assembly 16. Each optical mount isolator 37 can include a pneumatic cylinder (not shown) that isolates vibration and an actuator (not shown) that isolates vibration and controls the position with at least two degrees of motion. Suitable optical mount isolators 37 are sold by Integrated Dynamics Engineering, located in Woburn, Mass. For ease of illustration, two spaced apart optical mount isolators 37 are shown as being used to secure the optical assembly 16 to the apparatus frame 12. However, for example, three spaced apart optical mount isolators 37 can be used to kinematically secure the optical assembly 16 to the apparatus frame 12.

The reticle stage assembly 18 holds and positions the reticle 28 relative to the optical assembly 16 and the wafer 30.

In one embodiment, the reticle stage assembly 18 includes a reticle stage 38 that retains the reticle 28 and a reticle stage mover assembly 40 that moves and positions the reticle stage 38 and reticle 28.

Somewhat similarly, the device stage assembly 20 holds and positions the wafer 30 with respect to the projected image of the illuminated portions of the reticle 28. In one embodiment, the device stage assembly 20 includes a device stage 42 that retains the wafer 30, a device stage base 43 that supports and guides the device stage 42, and a device stage mover assembly 44 that moves and positions the device stage 42 and the wafer 30 relative to the optical assembly 16 and the device stage base 43. The device stage 42 is described in more detail below.

Each stage mover assembly 40, 44 can move the respective stage 38, 42 with three degrees of freedom, less than three degrees of freedom, or more than three degrees of freedom. For example, in alternative embodiments, each stage mover assembly 40, 44 can move the respective stage 38, 42 with one, two, three, four, five or six degrees of freedom. The reticle stage mover assembly 40 and the device stage mover assembly 44 can each include one or more movers, such as rotary motors, voice coil motors, linear motors utilizing a Lorentz force to generate drive force, electromagnetic movers, planar motors, or other force movers.

In photolithography systems, when linear motors (see U.S. Pat. Nos. 5,623,853 or 5,528,118) are used in the device stage assembly or the reticle stage assembly, the linear motors can be either an air levitation type employing air bearings or a magnetic levitation type using Lorentz force or reactance force. Additionally, the stage could move along a guide, or it could be a guideless type stage that uses no guide. The disclosures of U.S. Pat. Nos. 5,623,853 and 5,528,118 are incorporated herein by reference in their entireties.

Alternatively, one of the stages could be driven by a planar motor that drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage base and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and Japanese Laid-Open Patent Application Publication No. 8-136475. Additionally, reaction forces generated by the reticle (mask) stage motion can be mechanically transferred to the floor (ground) by use of a frame member as described in U.S. Pat. No. 5,874,820 and Japanese Laid-Open Patent Application Publication No. 8-330224. The disclosures of U.S. Pat. Nos. 5,528,100 and 5,874,820 and Japanese Laid-Open Patent Application Publication Nos. 8-136475 and 8-330224 are incorporated herein by reference in their entireties.

The measurement system 22 monitors movement of the reticle 28 and the wafer 30 relative to the optical assembly 16 or some other reference. With this information, the control system 24 can control the reticle stage assembly 18 to precisely position the reticle 28 and the device stage assembly 20 to precisely position the wafer 30. The design of the measurement system 22 can vary. For example, the measurement system 22 can utilize multiple laser interferometers, encoders, mirrors, and/or other measuring devices.

The control system 24 is electrically connected to the measurement system 22 and the stage mover assemblies 40, 44, receives information from the measurement system 22, and controls the stage mover assemblies 40, 44 to precisely position the reticle 28 and the wafer 30. Additionally, the control system 24 can control the operation of the components of the environmental system 26. The control system 24 can include one or more processors and circuits.

The environmental system 26 controls the environment in a gap 246 (illustrated in FIG. 2A) between the optical assembly 16 and the wafer 30. The gap 246 includes an imaging field. The imaging field includes the area adjacent to the region of the wafer 30 that is being exposed and the area in which the beam of light energy travels between the optical assembly 16 and the wafer 30. With this design, the environmental system 26 can control the environment in the imaging field.

The desired environment created and/or controlled in the gap 246 by the environmental system 26 can vary according to the wafer 30 and the design of the rest of the components of the exposure apparatus 10, including the illumination system 14. For example, the desired controlled environment can be a fluid such as water. Alternatively, the desired controlled environment can be another type of fluid.

Figure 2A:
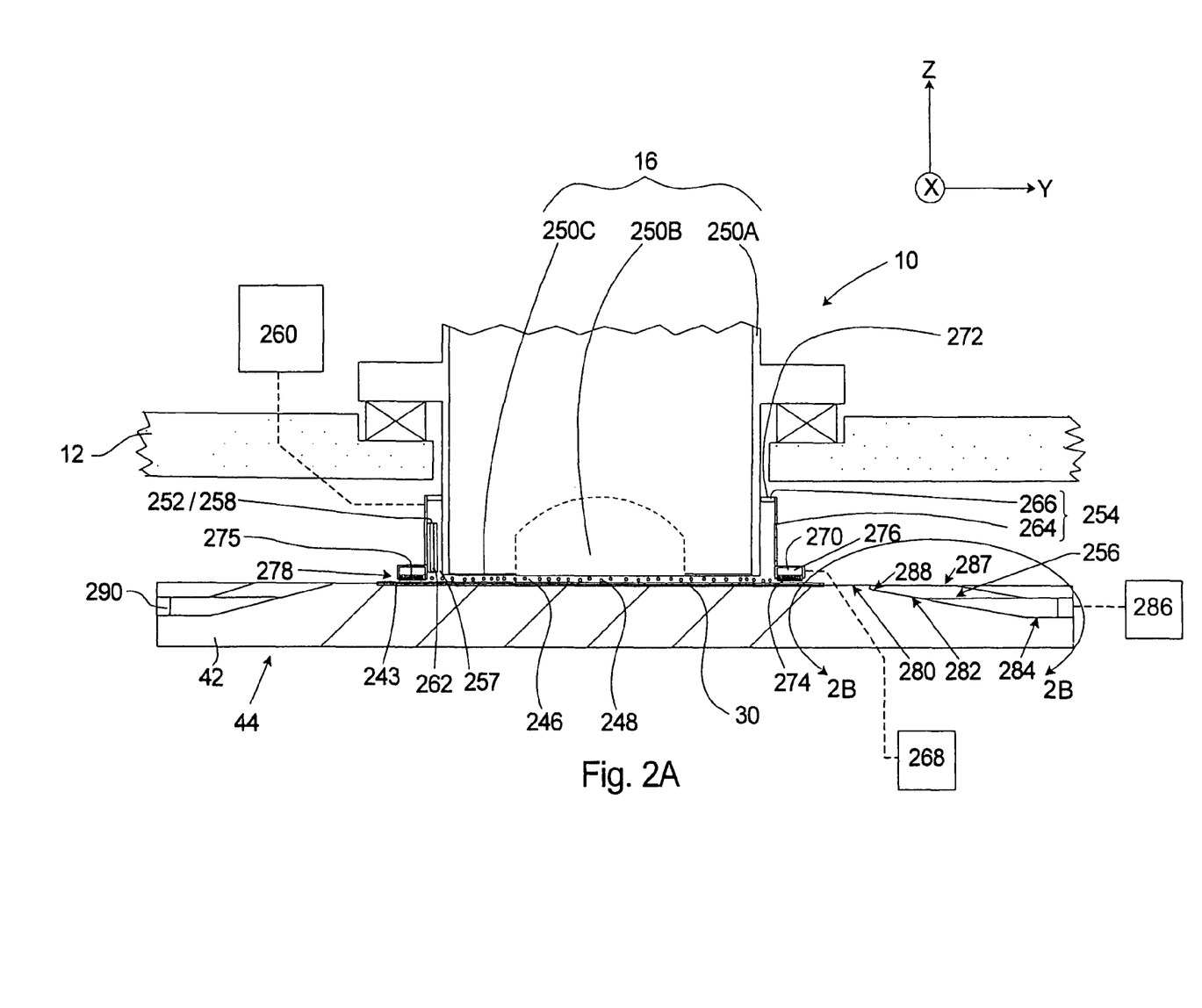
FIG. 2A is a cut-away view taken on line 2A-2A of FIG. 1.

FIG. 2A is a cut-away view of the portion of the exposure apparatus 10 of FIG. 1, including the optical assembly 16, the device stage 42, and the environmental system 26. FIG. 2A illustrates that the optical assembly 16 includes an optical housing 250A, a last optical element 250B, and an element retainer 250C that secures the last optical element 250B to the optical housing 250A. Additionally, FIG. 2A illustrates the gap 246 between the last optical element 250B and the wafer 30. In one embodiment, the gap 246 is approximately 1 mm.

In FIG. 2A, the device stage 42 retains a support 243 (illustrated as a box) that retains and supports the device 30. For example, the support 243 can be a vacuum type chuck or another type of clamp that retains the device.

In one embodiment, the environmental system 26 fills the imaging field and the rest of the gap 246 with an immersion fluid 248 (illustrated as circles). The design of the environmental system 26 and the components of the environmental system 26 can be varied. In the embodiment illustrated in FIG. 2A, the environmental system 26 includes an immersion fluid system 252, a first recovery system 254, and a second recovery system 256. In this embodiment, (i) the immersion fluid system 252 delivers and/or injects the immersion fluid 248 into the gap 246, (ii) the first recovery system 254 recovers a portion of the immersion fluid 248 that exits the gap 246, and (iii) the second recovery system 256 recovers immersion fluid 248 that exits the gap 246 that is not captured by the first recovery system 254. The design of each system 252, 254, 256 can be varied.

In one embodiment, the first recovery system 254 recovers more of the immersion fluid 248 that is exiting from the gap 246 than the second recovery system 256. For example, in alternative embodiments, the first recovery system 254 can recover approximately 10, 20, 30, 40, 50, 60, 70, 80, 90, 95 or 99 percent more than the second recovery system 256. In one embodiment, the first recovery system 254 captures the majority of the immersion fluid 248 and inhibits the immersion fluid 248 from spilling or dripping onto various parts of the exposure apparatus 10 that surrounds the wafer 30, and the first recovery system 254 defines a chamber 257 around the gap 246.

In another embodiment, the second recovery system 256 recovers more of the immersion fluid 248 that is exiting from the gap 246 than the first recovery system 254. For example, in alternative embodiments, the second recovery system 256 can recover approximately 10, 20, 30, 40, 50, 60, 70, 80, 90, 95 or 99 percent more than the first recovery system 254. Alternatively, for example, the environmental system 26 can be designed without the first recovery system 254. In this embodiment, the second recovery system 256 would recover all of the immersion fluid 248 exiting from the gap 246.

The design of the immersion fluid system 252 can vary. For example, the immersion fluid system 252 can inject the immersion fluid 248 at one or more locations at or near the gap 246 and the chamber 257, the edge of the optical assembly 16, and/or directly between the optical assembly 16 and the wafer 30. Further, the immersion fluid system 252 can assist in removing and/or scavenging the immersion fluid 248 at one or more locations at or near the device 30, the gap 246 and/or the edge of the optical assembly 16.

In the embodiment illustrated in FIG. 2A, the immersion fluid system 252 includes one or more injector nozzles 258 (only one is illustrated) positioned near the perimeter of the optical assembly 16 and an immersion fluid source 260. In this embodiment, each of the injector nozzles 258 includes a nozzle outlet 262 that is in fluid communication with the immersion fluid source 260. At the appropriate time, the immersion fluid source 260 provides immersion fluid 248 to the one or more nozzle outlets 262 that is released into the chamber 257.

The immersion fluid source 260 can include (i) a fluid reservoir (not shown) that retains the immersion fluid 248, (ii) a filter (not shown) in fluid communication with the fluid reservoir that filters the immersion fluid 248, (iii) an aerator (not shown) in fluid communication with the filter that removes any air, contaminants, or gas from the immersion fluid 248, (iv) a temperature controller (not shown), e.g., a heat exchanger or chiller, in fluid communication with the aerator that controls the temperature of the immersion fluid 248, (v) a pressure source (not shown), e.g., a pump, in fluid communication with the temperature controller, and (vi) a flow controller (not shown) that has an inlet in fluid communication with the pressure source and an outlet in fluid communication with the nozzle outlets 262 (illustrated in FIG. 2C), the flow controller controlling the pressure and flow to the nozzle outlets 262. Additionally, the immersion fluid source 260 can include (i) a pressure sensor (not shown) that measures the pressure of the immersion fluid 248 that is delivered to the nozzle outlets 262, (ii) a flow sensor (not shown) that measures the rate of flow of the immersion fluid 248 to the nozzle outlets 262, and (iii) a temperature sensor (not shown) that measures the temperature of the immersion fluid 248 to the nozzle outlets 262. The operation of these components can be controlled by the control system 24 (illustrated in FIG. 1) to control the flow rate, temperature and/or pressure of the immersion fluid 248 to the nozzle outlets 262. The information from these sensors can be transferred to the control system 24 so that the control system 24 can appropriately adjust the other components of the immersion fluid source 260 to achieve the desired temperature, flow and/or pressure of the immersion fluid 248.

It should be noted that orientation of the components of the immersion fluid source 260 can be varied. Further, one or more of the components may not be necessary and/or some of the components can be duplicated. For example, the immersion fluid source 260 can include multiple pumps, multiple reservoirs, temperature controllers or other components. Moreover, the environmental system 26 can include multiple immersion fluid sources 260.

The rate at which the immersion fluid 248 is pumped into the gap 246 (illustrated in FIG. 2B) can vary. For example, the immersion fluid 248 can be supplied to the gap 246 via the nozzle outlets 262 at a rate of between approximately 0.5 liters/min. to 1.5 liters/min.

The type of immersion fluid 248 can be varied to suit the design requirements of the apparatus 10. In one embodiment, the immersion fluid 248 is a fluid such as de-gassed, de-ionized water. Alternatively, for example, the immersion fluid 248 can be another type of fluid.

FIG. 2A also illustrates that the immersion fluid 248 in the chamber 257 sits on top of the wafer 30. As the wafer 30 moves under the optical assembly 16, it will drag the immersion fluid 248 in the vicinity of the top surface of the wafer 30 with the wafer 30 into the gap 246.

The first recovery system 254 includes (i) a containment frame 264 that surrounds the gap 246 and forms the chamber 257 near the gap 246, (ii) a frame support 266 that supports the containment frame 264 and (iii) a first recovery device 268. In one embodiment, the containment frame 264 restricts the flow of the immersion fluid 248 from the gap 246, assists in maintaining the gap 246 full of the immersion fluid. 248, and facilitates the recovery of the immersion fluid 248 that escapes from the gap 246. In one embodiment, the containment frame 264 encircles and is positioned entirely around the gap 246 and the bottom of the optical assembly 16. Further, in one embodiment, the containment frame 264 confines the immersion fluid 248 to a region on the wafer 30 and the device stage 42 under the optical assembly 16. Alternatively, for example, the containment frame 264 can be positioned around only a portion of the gap 246 or the containment frame 264 can be off-center of the optical assembly 16.

In one embodiment, the containment frame 264 is generally annular ring shaped and encircles the gap 246. Additionally, in this embodiment, the containment frame 264 defines a channel 270 having an open bottom that faces the wafer 30 and the gap 246. The containment frame 264 can have another shape. For example, the containment frame 264 can be rectangular frame shaped, octagonal frame shaped, oval frame shaped, or another suitable shape.

The frame support 266 connects and supports the containment frame 264 to the apparatus frame 12, another structure, and/or the optical assembly 16, above the wafer 30 and the device stage 42. In one embodiment, the frame support 266 supports all of the weight of the containment frame 264. Alternatively, for example, the frame support 266 can support only a portion of the weight of the containment frame 264. In this embodiment, a fluid bearing (not shown) or another device can be used to support the containment frame relative to the wafer 30.

In one embodiment, the frame support 266 can include one or more support assemblies 272. For example, the frame support 266 can include three spaced apart support assemblies 272 (only two are illustrated in FIG. 2A). In this embodiment, each support assembly 272 extends between the optical assembly 16 and the inner side of the containment frame 264.

In one embodiment, each support assembly 272 is a mount that rigidly secures the containment frame 264 to the optical assembly 16. Alternatively, for example, each support assembly can be a flexure that supports the containment frame 264 in a flexible fashion. As used herein, the term "flexure" shall mean a part that has relatively high stiffness in some directions and relatively low stiffness in other directions. In one embodiment, the flexures cooperate (i) to be relatively stiff along the X axis and along the Y axis, and (ii) to be relatively flexible along the Z axis. In this embodiment, the flexures can allow for motion of the containment frame 264 along the Z axis and inhibit motion of the containment frame 264 along the X axis and the Y axis.

Alternatively, for example, each support assembly 272 can be an actuator that can be used to adjust the position of the containment frame 264 relative to the wafer 30 and the device stage 42. In this embodiment, the frame support 266 can also include a frame measurement system (not shown) that monitors the position of the containment frame 264. For example, the frame measurement system can monitor the position of the containment frame 264 along the Z axis, about the X axis, and/or about the Y axis. With this information, the support assemblies 272 can be used to adjust the position of the containment frame 264. In this embodiment, the support assemblies 272 can actively adjust the position of the containment frame 264.

FIG. 2A also illustrates that the first recovery system 254 can include a transport region 274. In one embodiment, the transport region 274 is a substrate 275 that is substantially annular disk shaped, encircles the gap 246, and is substantially concentric with the optical assembly 16. Alternatively, for example, the transport region 274 can be another shape, including oval frame shaped, rectangular frame shaped or octagonal frame shaped. Still alternatively, for example, the transport region 274 can include a plurality of substrate segments that cooperate to encircle a portion of the gap 246, and/or a plurality of substantially concentric substrates.

In this embodiment, the transport region 274 is secured to the containment frame 264 at or near the bottom side and cooperates with the containment frame 264 to form a removal chamber 276 next to and above the transport region 274. In this embodiment, the transport region 274 captures, retains, and/or absorbs at least a portion of the immersion fluid 248 that flows between the containment frame 264 and the wafer 30 and/or the device stage 42. The type of material utilized in the transport region 274 can vary. As an example, the transport region 274 can be a material having a plurality of pores that convey the immersion fluid 248 by capillary action. Examples of suitable materials include wick type structures made of metals, glasses, or ceramics.

The first recovery device 268 is in fluid communication with the transport region 274 and the removal chamber 276. With this design, the immersion fluid 248 can be captured with the transport region 274 and removed by the first recovery device 268. In one embodiment, the first recovery device 268 removes the immersion fluid 248 from the top of the transport region 274, allowing additional immersion fluid 248 to flow into the bottom of the transport region 274.

In one embodiment, the first recovery device 268 includes a low pressure source that creates a low pressure in the removal chamber 276. In this embodiment, the low pressure source can include a pump or vacuum source, and a chamber pressure regulator for precisely controlling the pressure in the removal chamber 276. The orientation of the components of the first recovery device 268 can be varied. Further, one or more of the components may not be necessary and/or some of the components can be duplicated. For example, the first recovery device 268 can include multiple pumps, multiple reservoirs, valves, or other components. Moreover, the environmental system 26 can include multiple first recovery devices 268.

In an alternative embodiment, the control system 24 (illustrated in FIG. 1) could be electrically connected to the transport region 274 and can apply an electrical voltage to the transport region 274. With this design, the transport region 274 functions as an electrokinetic sponge that captures the immersion fluid 248 that is exiting the gap 246. In yet another embodiment, the bottom of the containment frame 264 can be open.

FIG. 2A illustrates that a frame gap 278 exists between (i) the bottom of the containment frame 264 and the transport region 274, and (ii) the wafer 30 and/or the device stage 42 to allow for ease of movement of the device stage 42 and the wafer 30 relative to the containment frame 264. The size of the frame gap 278 can vary. In one embodiment, the frame gap 278 is between approximately 0.1 and 2 mm. In alternative examples, the frame gap 278 can be less than 0.1 mm or greater than 2 mm.

With this embodiment, most of the immersion fluid 248 is confined within the containment frame 264 and most of the leakage around the periphery is scavenged within the narrow frame gap 278 by the transport region 274. In this case, when the immersion fluid 248 touches the transport region 274, it is drawn into the transport region 274 and absorbed. Thus, the transport region 274 prevents any immersion fluid 248 from flowing outside the containment frame 264.

It should be noted that in each embodiment, additional transport regions can be added as necessary.

FIG. 2A also illustrates that the second recovery system 256 can include a boundary region 280, a sloped region 282, a collection region 284, and a second recovery device 286. In one embodiment, the sloped region 282 and the collection region 284 are designed to utilize the repetitive acceleration and deceleration of the device stage 42 to move the immersion fluid 248 down the sloped region 282 toward the collection region 284.

In FIG. 2A, the boundary region 280, the sloped region 282, and the collection region 284 are disposed in the device stage 42 of the device stage mover assembly 44. Stated another way, a channel 287 in the device stage 42 defines the sloped region 282, and the collection region 284. Alternatively, for example, one or more of the regions 280, 282, 284 can be incorporated into an additional component that is secured to the device stage 42.

Figure 2B:
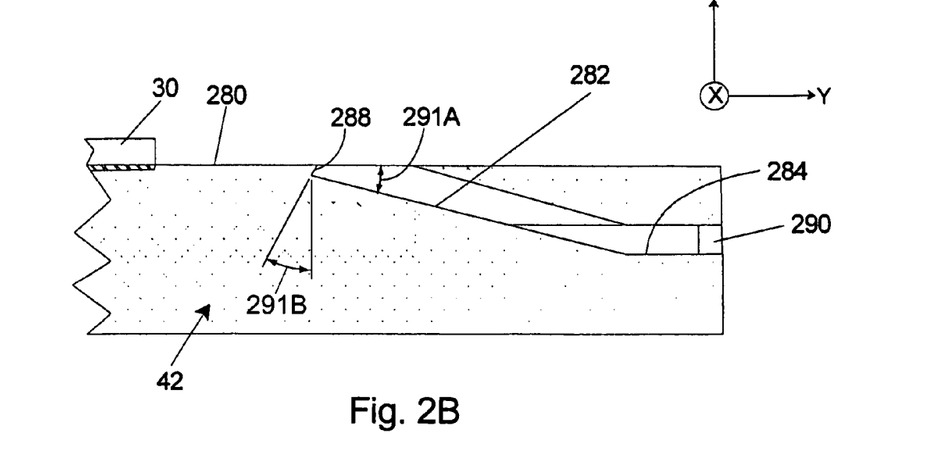
FIG. 2B is a cut-away view taken on line 2B-2B of FIG. 2A, and FIG. 2B' is a similar cut-away view of a modified embodiment.
Figure 2C:
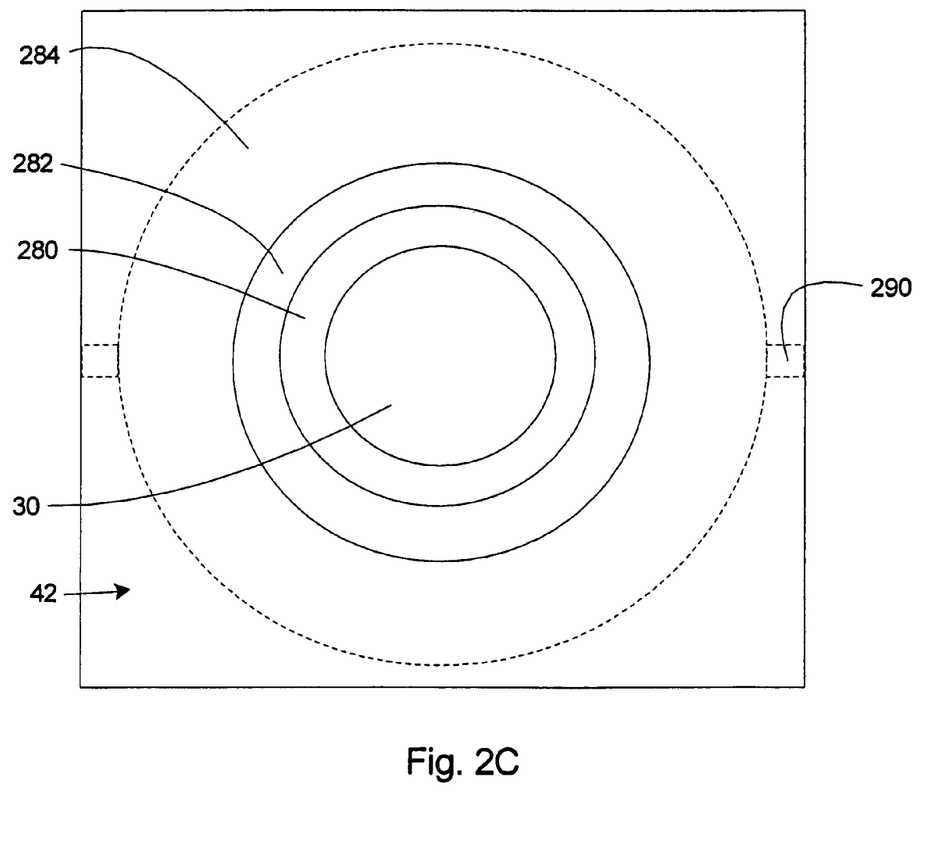
FIG. 2C is a top plan view of a device stage and device from FIG. 2A.

FIG. 2B illustrates a portion of the device 30 and the device stage 42 of FIG. 2A. FIG. 2C illustrates a top plan view of the device stage 42 and the device 30. FIGS. 2B and 2C also illustrate the boundary region 280, the sloped region 282, and the collection region 284.

Referring to FIGS. 2A-2C, the boundary region 280 provides a transition zone between the wafer 30 and sloped region 282. In one embodiment, the boundary region 280 is an annular shaped area that is on the same plane as the bottom of the wafer 30. Stated another way, the boundary region 280 has a top surface that is approximately the same height along the Z axis as the bottom of the wafer 30. With this design, the top surface can cooperate with the containment frame 264 to contain the immersion fluid 248 under the optical assembly 16 when the edge of the wafer 30 is moved under the optical assembly 16. Alternatively, for example, and as shown in FIG. 2B', the top surface of boundary region 280 can be approximately the same height along the Z axis as the top of the wafer 30. As another alternative, the top surface 280 could be below the wafer 30. In the embodiment illustrated in FIGS. 2A-2C, the boundary region 280 is positioned above the sloped region 282 and the collection region 284 along the Z axis.

The sloped region 282 extends between the boundary region 280 and the collection region 284 and facilitates movement of the immersion fluid 248 that escapes from the gap 246 away from the wafer 30. In one embodiment, the sloped region 282 is generally annular shaped and is at an acute angle relative to the boundary region 280 and the X and Y axes. Stated another way, the sloped region 282 can taper downward from the boundary region 280. For example, the sloped region 282 can be at an angle 291A of at least approximately 2 degrees or more relative to the boundary region 280. In alternative embodiments, the sloped region 282 can be at an angle 291A of at least approximately 1, 2, 3, 5, 10, or 20 degrees relative to the boundary region 280 or the bottom or top of the wafer 30.

In one embodiment, the sloped region 282 is positioned near the wafer 30. In alternative embodiments, the sloped region 282 is within approximately 5, 10, 20, 30, 40 or 50 mm of the wafer 30. Alternatively, the sloped region 282 can be closer than 5 mm or greater than 50 mm from the wafer 30.

Further, in one embodiment, a drop down region 288 is positioned between the boundary region 280 and the sloped region 282. The drop down region 288 inhibits immersion fluid 248 near the top of the sloped region 282 from being propelled back onto the boundary region 280 when the device stage 42 is accelerated. In FIG. 2A, the drop down region 288 is at an acute angle relative to the Z axis (perpendicular to the boundary region 280 and the wafer 30). In alternative embodiments, the drop down region 288 can be at an angle 291B of at least approximately 2, 5, 10, or 15 degrees relative to the Z axis. Alternatively, for example, the drop down region 288 can extend along the Z axis substantially perpendicular to the boundary region 280.

The collection region 284 collects the immersion fluid 248 that flows down the sloped region 282. In one embodiment, the collection region 284 is positioned below the sloped region 282. In one embodiment, the collection region 284 includes one or more channel outlets 290 that are in fluid communication with the second recovery device 286 (illustrated in FIG. 2A).

The second recovery device 286 recovers immersion fluid 248 from the collection region 284. In one embodiment, the second recovery device 286 includes a low pressure source that creates a low pressure in the collection region 284. In this embodiment, the low pressure source can include a pump or vacuum source, and a pressure regulator for precisely controlling the pressure in the collection region 284. One or more of the components may not be necessary and/or some of the components can be duplicated. For example, the second recovery device 286 can include multiple pumps, multiple reservoirs, valves, or other components.

Figure 3A:
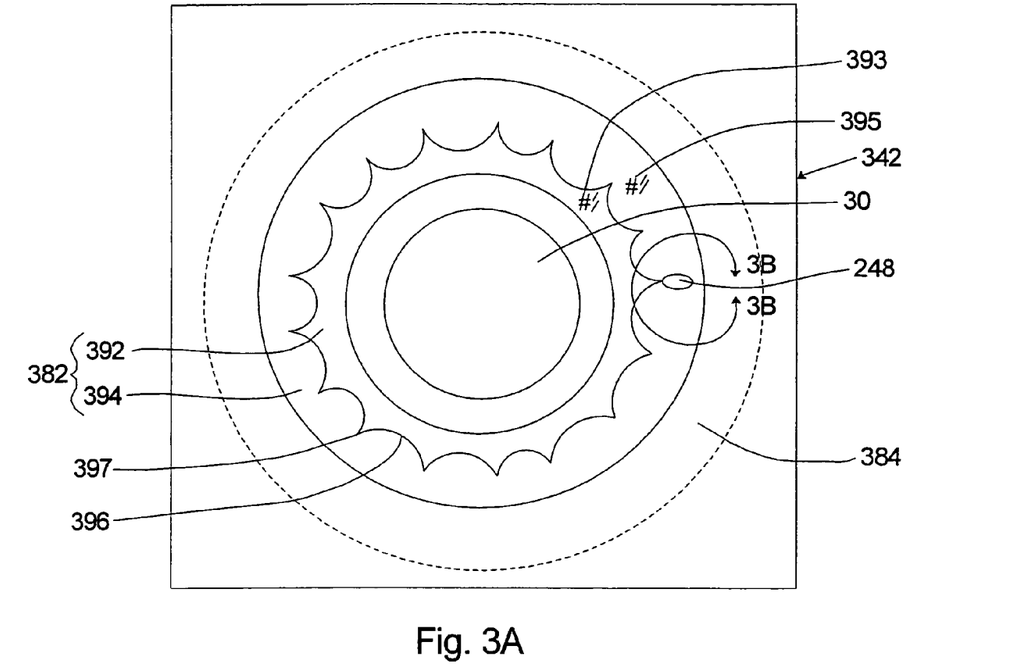
FIG. 3A is a top plan view of a device and another embodiment of a device stage having features of the invention.

FIG. 3A illustrates a top view of the device 30 and another embodiment of the device stage 342. In this embodiment, the device stage 342 is somewhat similar to the corresponding component described above. However, in this embodiment, the sloped region 382 is slightly different. More specifically, in this embodiment, the sloped region 382 includes a first subregion 392 having a first characteristic 393 (illustrated as shading) and a second subregion 394 having a second characteristic 395 (illustrated as shading) that is different than the first characteristic 393.

The design of the first and second subregions 392, 394 can be varied to facilitate one-way movement of the immersion fluid 248 (illustrated as a drop) down the sloped region 382 toward the collection region 384 (illustrated in phantom). In the embodiment illustrated in FIG. 3A, the first subregion 392 is positioned above the second subregion 394. Further, in this embodiment, a transition 396 between the first subregion 392 and the second subregion 394 is defined by a plurality of interconnected arch shaped segments that define a plurality of spaced apart sharp points 397. Stated another way, at the transition 396, the second subregion 394 includes a plurality of interconnected, adjacent, concave areas and the first subregion 392 includes a plurality of interconnected, adjacent, convex areas.

The design of the first characteristic 393 and the second characteristic 395 can vary. In one embodiment, (i) the first characteristic 393 is a first surface tension modifying coating that coats the first subregion 392 and modifies movement of the immersion fluid 248 across the first subregion 392, and (ii) the second characteristic 395 is a second surface tension modifying coating that coats the second subregion 394 and modifies movement of the immersion fluid 248 across the second subregion 394.

In one embodiment, (i) the first characteristic 393 is a hydrophobic type coating that repels the immersion fluid 248, and causes the immersion fluid 248 to form beads on the first subregion 392 and not wet the first subregion 392 and (ii) the second characteristic 395 is a hydrophilic type coating that can cause the immersion fluid 248 to wet the second subregion 394 and not bead up on the second subregion 394. With this design, in certain embodiments, immersion fluid 248 may actually act as a sheet on the second subregion 394 that can be controllably moved toward the collection region 284.

Alternatively, for example, the coatings in the first and second subregions 392, 394 can be switched, the same coating can be applied to the first and second subregions 392, 394, or the first and second subregions 392, 394 may not be coated. Still alternatively, the first and second subregions 392, 394 can be at different slopes or levels.

Figure 3B:
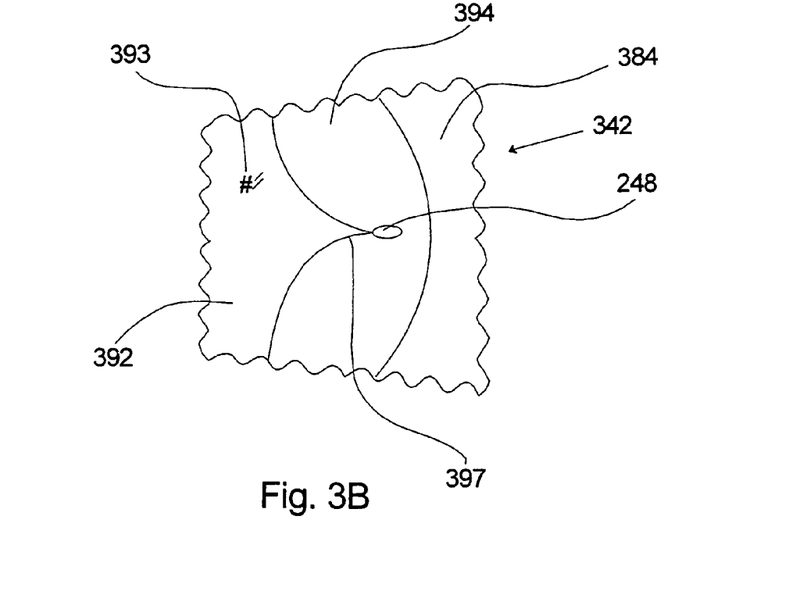
FIG. 3B is a cut-away view taken on line 3B-3B of FIG. 3A.

FIG. 3B illustrates a portion of the device stage 342 from FIG. 3A. More specifically, FIG. 3B illustrates that the sharp points.397 (only one shown) in conjunction with the first characteristic 395 will act to inject the immersion fluid 248 toward the second subregion 394 and the collection region 384 when the device stage 342 is accelerated into this particular point 397. This is because the point 397 concentrates the pressure of the immersion fluid 248, and the immersion fluid 248 will break free of the first subregion 392 when the immersion fluid 248 thickness is sufficient.

Referring back to FIG. 3A, because there are no sharp points between the first subregion 392 and the device 30, there is less tendency for the immersion fluid 248 to move from the first subregion 392 back toward the device 30. The net effect is a constant movement of the immersion fluid 248 from the inner diameter of the first subregion 392 to the outer diameter of the first subregion 392, and the movement of the immersion fluid 248 from the first subregion 392 to the second subregion 394 as the immersion fluid 248 is broken free at the points 397.

Figure 4:
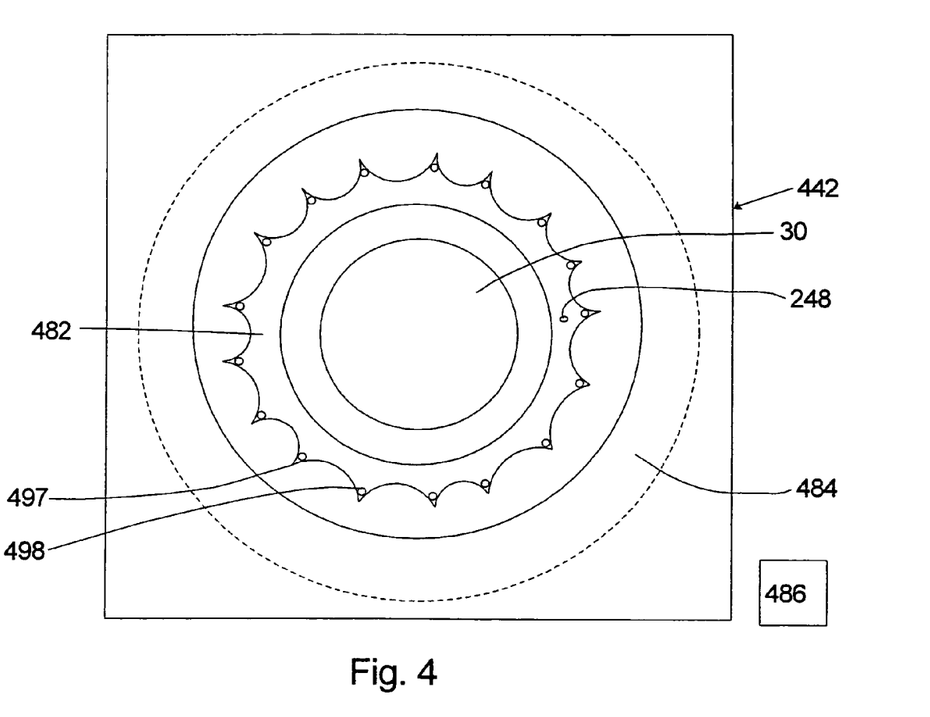
FIG. 4 is a top plan view of a device and another embodiment of a device stage having features of the invention.

FIG. 4 illustrates a top plan view of the device 30 and another embodiment of a device stage 442 having features of the invention. In this embodiment, the device stage 442 is somewhat similar to the device stage 342 illustrated in FIGS. 3A and 3B and described above. However, in this embodiment, the sloped region 482 includes one or more collection apertures 498 strategically located to enhance the collection of the immersion fluid 248. The collection apertures 498 can be in fluid communication with a second recovery device 486 that creates a low pressure in the collection apertures 498 to draw the immersion fluid 248 at the collection apertures 498.

In one embodiment, one collection aperture 498 is positioned near each point 497. Alternatively, for example, the collection apertures 498 can be positioned in other locations in the sloped region 482.

In this embodiment, the collection apertures 498 can be designed to collect all of the immersion fluid 248 in the sloped region 482. With this design, a minimal amount of immersion fluid 248 is collected in the collection region 484. Alternatively, for example, the collection apertures 498 can be designed to collect only a portion of the immersion fluid 248 in the sloped region 482. With this design, the collection region 484 collects any immersion fluid 248 not collected by the collection apertures 498.

Figure 5A:
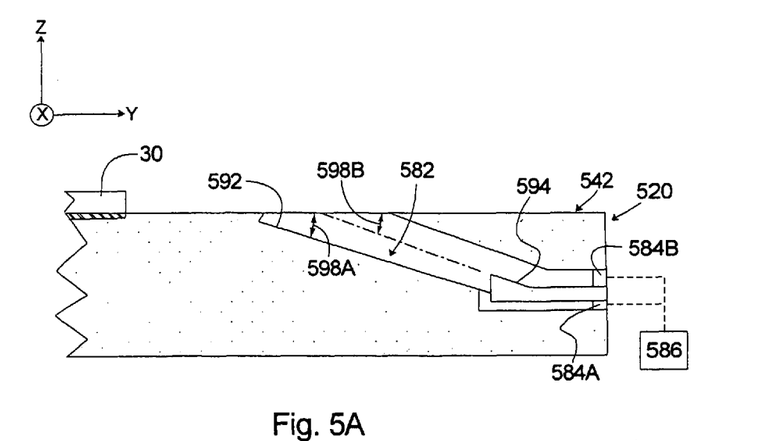
FIG. 5A is an enlarged side cut-away view of a portion of a device and another embodiment of a device stage.
Figure 5B:
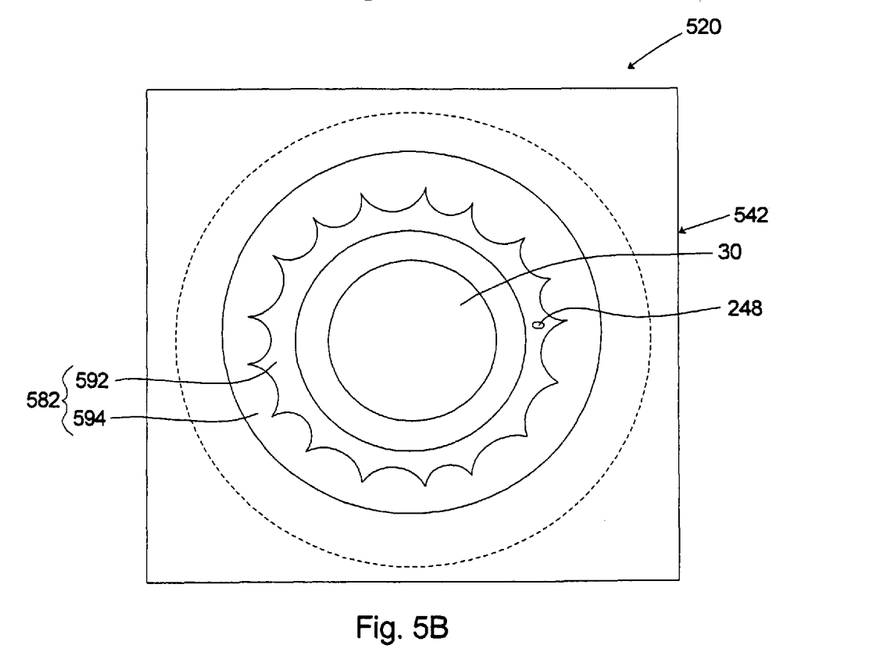
FIG. 5B is a top plan view of a portion of the device stage of FIG. 5A.

FIG. 5A is an enlarged side cut-away view of a portion of the device 30 and another embodiment of a device stage 542, and FIG. 5B is a top plan view of the device 30 and the device stage 542 of FIG. 5A.

In this embodiment, the sloped region 582 includes a first subregion 592 and a second subregion 594. Further, in this embodiment, the first subregion 592 is at a first angle 598A relative to the X and Y axes and a top or bottom of the device 30, the second subregion 594 is at a second angle 598B relative to the X and Y axes and the top or bottom of the device 30, and the first angle 598A may be the same or different than the second angle 598B. In alternative examples, the first angle 598A can be approximately 10, 20, 30, 40 or 45 degrees and the second angle 598B can be approximately 10, 20, 30, 40, or 45 degrees. In this embodiment, the mechanical geometry of the sloped region 582 collects and controls the flow of the immersion fluid.

In one embodiment, the device stage assembly 520 also includes a first collection region 584A that is in fluid communication with the first subregion 592, a second collection region 584B that is in fluid communication with the second subregion 594, and a second recovery device 586 that removes immersion fluid from the collection regions 584A, 584B. In one embodiment, the second recovery device 586 includes a low pressure source that creates a low pressure in the collection regions 584A, 584B.

In this embodiment, the system can be designed so that the first collection region 584A collects all of the immersion fluid 248. With this design, no immersion fluid 248 is collected in the second collection region 584B. Stated another way, the second collection region 584B can be optional, as it may not be needed, depending on the volume of immersion fluid 248 to be collected, and on the device stage 542 acceleration and deceleration. Alternatively, for example, the first collection region 584A can only collect a portion of the immersion fluid 248 in the sloped region 582. With this design, the second collection region 584B collects any immersion fluid 248 not collected by the first collection region 584A.

Also, in this embodiment, the nature of the coatings of the first and second subregions 592, 594 may be less important. For example, the coatings of one or both of the first and second subregions 592, 594 can be considered optional.

Figure 6A:
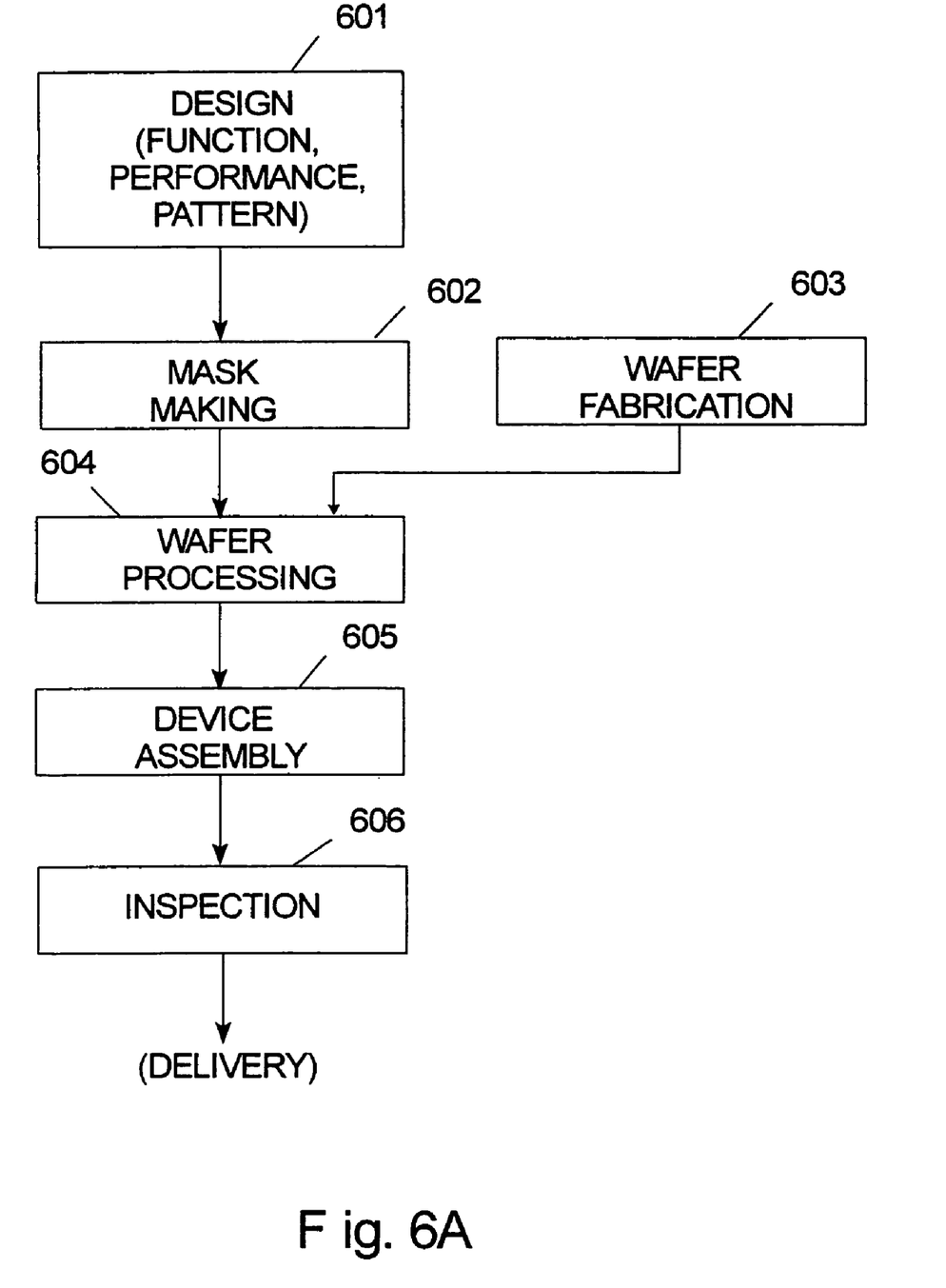
FIG. 6A is a flow chart that outlines a process for manufacturing a device in accordance with the invention.

Semiconductor devices can be fabricated using the above described systems, by the process shown generally in FIG. 6A. In step 601 the device's function and performance characteristics are designed. Next, in step 602, a mask (reticle) having a pattern is designed according to the previous designing step, and in a parallel step 603 a wafer is made from a silicon material. The mask pattern designed in step 602 is exposed onto the wafer from step 603 in step 604 by a photolithography system described hereinabove in accordance with the invention. In step 605, the semiconductor device is assembled (including the dicing process, bonding process and packaging process). Finally, the device is inspected in step 606.

Figure 6B:
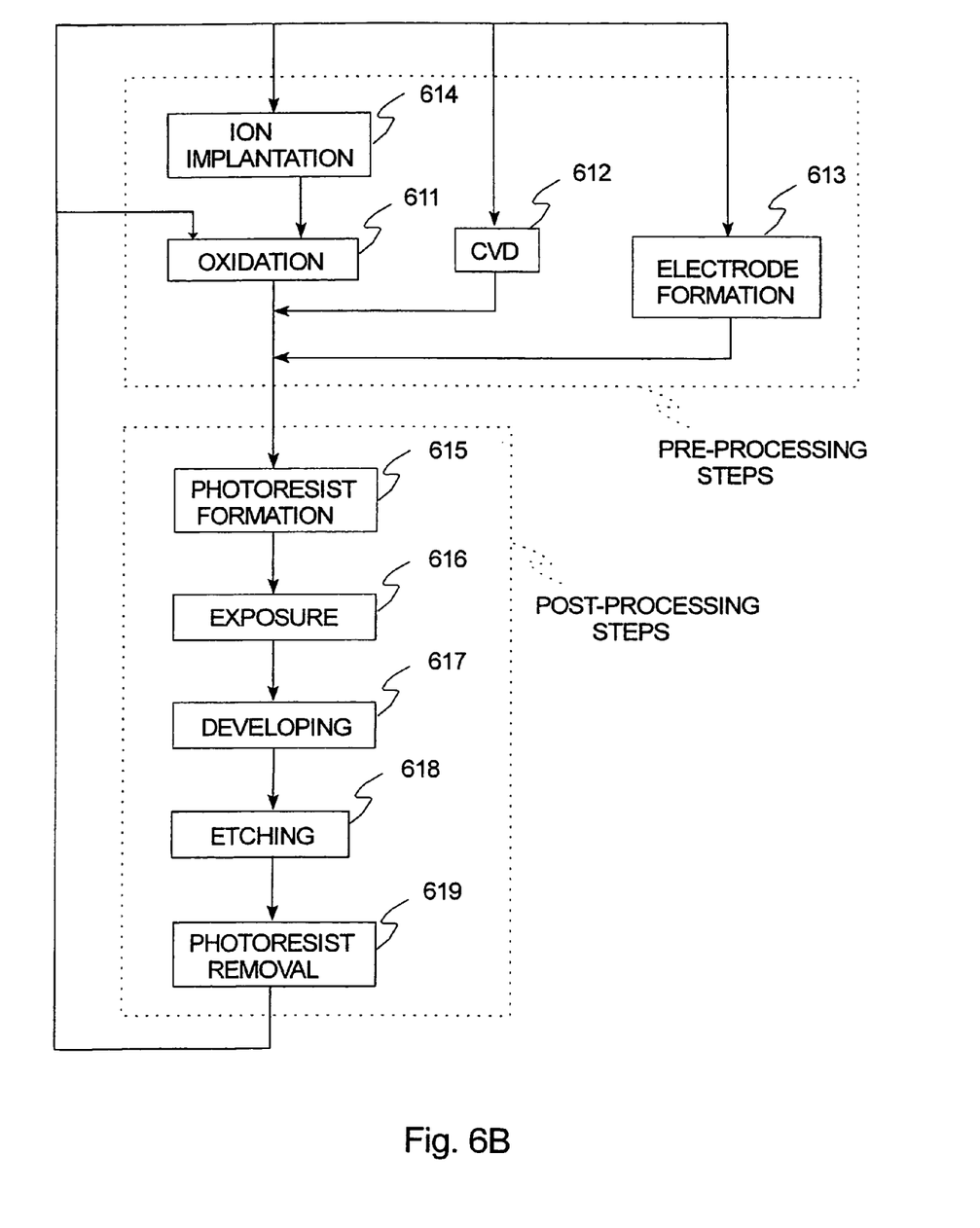
FIG. 6B is a flow chart that outlines device processing in more detail.

FIG. 6B illustrates a detailed flowchart example of the above-mentioned step 604 in the case of fabricating semiconductor devices. In FIG. 6B, in step 611 (oxidation step), the wafer surface is oxidized. In step 612 (CVD step), an insulation film is formed on the wafer surface. In step 613 (electrode formation step), electrodes are formed on the wafer by vapor deposition. In step 614 (ion implantation step), ions are implanted in the wafer. The above mentioned steps 611-614 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 615 (photoresist formation step), photoresist is applied to a wafer. Next, in step 616 (exposure step), the above-mentioned exposure device is used to transfer the circuit pattern of a mask (reticle) to a wafer. Then in step 617 (developing step), the exposed wafer is developed, and in step 618 (etching step), parts other than residual photoresist (exposed material surface) are removed by etching. In step 619 (photoresist removal step), unnecessary photoresist remaining after etching is removed.

Multiple circuit patterns are formed by repetition of these preprocessing and post-processing steps.

While the particular exposure apparatus 10 as shown and described herein is fully capable of obtaining the objects and providing the advantages previously stated, it is to be understood that it is merely illustrative of the embodiments of the invention, and that no limitations are intended to the details of construction or design herein shown.

What is claimed is:

1. An apparatus comprising:
a support that supports a workpiece;
an optical assembly that projects an image onto an upper surface of the workpiece through an immersion liquid filled in a gap between the optical assembly and a part of the upper surface of the workpiece such that the immersion liquid covers only an area smaller than an area of the upper surface of the workpiece; and
a stage assembly that is movable relative to the optical assembly, the stage assembly including the support, a drop-down region, a lyophobic region and a collection region, the stage assembly being capable of collecting the immersion liquid through the drop-down region, the lyophobic region and the collection region, wherein the drop-down region continuously encircles the support, the lyophobic region includes a lyophobic surface that continuously encircles the support and a circumference of the workpiece supported by the support, the collection region from which the immersion liquid is collected from the lyophobic region includes an opening that is disposed below a bottom surface of the workpiece supported by the support and radially outward of the circumference of the workpiece, and the collection region encircles both the drop-down region and the lyophobic surface.

2. The apparatus according to claim 1, wherein the lyophobic region includes a coating of a lyophobic material.

3. The apparatus according to claim 1, wherein the lyophobic region extends radially outward of the workpiece supported by the support, relative to a center of the workpiece.

4. The apparatus according to claim 1, further comprising a low pressure source that communicates with the opening of the collection region to remove the immersion liquid collected through the lyophobic region.

5. The apparatus according to claim 1, wherein:
the stage assembly includes a surface that surrounds the support;
the lyophobic region is disposed adjacent to the surface; and
the drop-down region is disposed between the surface and the lyophobic region.

6. The apparatus according to claim 5, wherein the surface is substantially level with the upper surface of the workpiece supported by the support.

7. The apparatus according to claim 1, wherein:
the stage assembly includes a surface that surrounds the support;
the lyophobic region is disposed adjacent to the surface; and
the lyophobic region is disposed lower than the surface.

8. The apparatus according to claim 7, wherein the surface is substantially level with the upper surface of the workpiece supported by the support.

9. The apparatus according to claim 1, wherein:
the lyophobic surface of the lyophobic region is disposed lower than the bottom surface of the workpiece supported by the support.

10. The apparatus according to claim 9, wherein the stage assembly includes a passage that communicates a low-pressure source with the opening of the collection region.

11. An immersion lithography method in which an image of a pattern is transferred onto an upper surface of a workpiece through an optical assembly and an immersion liquid disposed in a gap between the optical assembly and a part of the upper surface of the workpiece such that the immersion liquid covers only an area smaller than an area of the upper surface of the workpiece, the method comprising:
supporting the workpiece on a support of a stage assembly that is movable relative to the optical assembly, the stage assembly including the support, a drop-down region, a lyophobic region and a collection region; and
collecting the immersion liquid through the drop-down region, the lyophobic region and the collection region, the drop-down region continuously encircling the support, the lyophobic region including a lyophobic surface that continuously encircles the support and a circumference of the workpiece supported by the support, the collection region from which the immersion liquid is collected from the lyophobic region including an opening that is disposed below a bottom surface of the workpiece supported by the support and radially outward of the circumference of the workpiece, and the collection region encircles both the drop-down region and the lyophobic surface.

12. The method according to claim 11, wherein the lyophobic region includes a coating of a lyophobic material.

13. The method according to claim 11, wherein the lyophobic region extends radially outward of the workpiece supported by the support, relative to a center of the workpiece.

14. The method according to claim 11, wherein a low pressure source communicates with the opening of the collection region to remove the immersion liquid collected through the lyophobic region.

15. The method according to claim 11, wherein:
the stage assembly includes a surface that surrounds the support;
the lyophobic region is disposed adjacent to the surface; and
the drop-down region is disposed between the surface and the lyophobic region.

16. The method according to claim 15, wherein the surface is substantially level with the upper surface of the workpiece supported by the support.

17. The method according to claim 11, wherein:
the stage assembly includes a surface that surrounds the support;
the lyophobic region is disposed adjacent to the surface; and
the lyophobic region is disposed lower than the surface.

18. The method according to claim 17, wherein the surface is substantially level with the upper surface of the workpiece supported by the support.

19. The method according to claim 11, wherein:
the lyophobic surface of the lyophobic region is disposed lower than the bottom surface of the workpiece supported by the support.

20. The method according to claim 19, wherein the stage assembly includes a passage that communicates a low-pressure source with the opening of the collection region.

* * * * *